US009324846B1

(12) United States Patent
Camillo-Castillo et al.

(10) Patent No.: US 9,324,846 B1
(45) Date of Patent: Apr. 26, 2016

(54) FIELD PLATE IN HETEROJUNCTION BIPOLAR TRANSISTOR WITH IMPROVED BREAK-DOWN VOLTAGE

(71) Applicant: International Business Machines Corporation, Armonk, NY (US)

(72) Inventors: Renata A. Camillo-Castillo, Essex Junction, VT (US); Vibhor Jain, Essex Junction, VT (US); Marwan H. Khater, Astoria, NY (US); Santosh Sharma, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/591,946

(22) Filed: Jan. 8, 2015

(51) Int. Cl.
*H01L 29/45* (2006.01)
*H01L 29/737* (2006.01)
*H01L 29/08* (2006.01)
*H01L 29/06* (2006.01)
*H01L 21/265* (2006.01)
*H01L 29/40* (2006.01)
*H01L 29/66* (2006.01)
*H01L 29/417* (2006.01)
*H01L 29/423* (2006.01)
(Continued)

(52) U.S. Cl.
CPC ...... *H01L 29/7371* (2013.01); *H01L 21/26513* (2013.01); *H01L 29/0649* (2013.01); *H01L 29/0817* (2013.01); *H01L 29/0821* (2013.01); *H01L 29/1004* (2013.01); *H01L 29/165* (2013.01); *H01L 29/407* (2013.01); *H01L 29/41708* (2013.01); *H01L 29/42304* (2013.01); *H01L 29/45* (2013.01); *H01L 29/66242* (2013.01)

(58) Field of Classification Search
CPC ............ H01L 29/7371; H01L 29/42304; H01L 29/45; H01L 21/26513; H01L 29/66242; H01L 29/0821; H01L 29/165; H01L 29/41708; H01L 29/1004; H01L 29/0649; H01L 29/0817; H01L 29/407
See application file for complete search history.

(56) References Cited

U.S. PATENT DOCUMENTS 6,573,539 B2   6/2003   Huang
7,868,424 B2   1/2011   Hurkx et al.
(Continued)

OTHER PUBLICATIONS

Hueting et al., "A New Trench Bipolar Transistor for RF Applications", IEEE Transactions on Electron Devices, vol. 51, No. 7, Jul. 2004, pp. 1108-1113.
(Continued)

*Primary Examiner* — Roy Potter
*Assistant Examiner* — Paul Patton
(74) *Attorney, Agent, or Firm* — Anthony J. Canale

(57) ABSTRACT

A method of forming a heterojunction bipolar transistor including a field plate. The method may include forming: a substrate having a selectively implanted collector (SIC) and a collector separated by a shallow trench isolation (STI), a field plate in the STI, the field plate extends below a top surface of the SIC, a base layer directly on the SIC, a heterojunction bipolar transistor (HBT) structure above the SIC, the HBT includes an emitter, the emitter is directly on the base layer, a fourth dielectric layer covering the HBT structure, the field plate and the collector, and an emitter contact, a field plate contact and a collector contact extending through the fourth dielectric layer, the emitter contact is in electrical connection with the emitter, the field plate contact is in electrical connection with the field plate and the collector contact is in electrical connection with the collector.

20 Claims, 12 Drawing Sheets

(51) Int. Cl.
   *H01L 29/165*   (2006.01)
   *H01L 29/10*   (2006.01)

(56) References Cited

U.S. PATENT DOCUMENTS

| | | |
|---|---|---|
| 8,026,146 B2 | 9/2011 | Donkers et al. |
| 8,168,486 B2 | 5/2012 | Hébert |
| 8,421,185 B2 | 4/2013 | Chiu et al. |
| 8,598,678 B2 | 12/2013 | Qian et al. |
| 8,648,391 B2 | 2/2014 | Babcock et al. |
| 2013/0075746 A1* | 3/2013 | Mallikarjunaswamy ........... H01L 29/735 257/75 |
| 2013/0126945 A1 | 5/2013 | Liu et al. |
| 2013/0249057 A1 | 9/2013 | Babcock et al. |

OTHER PUBLICATIONS

Pekarik et al., "Co-integration of high-performance and high-breakdown SiGe HBTs in a BiCMOS technology", 2012 IEEE, 4 pages.

Yuan et al., "Design and Optimization of Superjunction Collectors for Use in High-Speed SiGe HBTs", IEEE Transactions on Electron Devices, vol. 58, No. 6, Jun. 2011, pp. 1655-1662.

* cited by examiner

FIELD PLATE IN HETEROJUNCTION BIPOLAR TRANSISTOR WITH IMPROVED BREAK-DOWN VOLTAGE

BACKGROUND

The present invention generally relates to semiconductor device manufacturing, and more particularly to the fabrication of a heterojunction bipolar transistor (HBT) and field plate with improved break-down voltage.

The bipolar transistor is an electronic device with two p-n junctions in close proximity. The bipolar transistor has three device regions: an emitter, a collector, and a base disposed between the emitter and the collector. Ideally, the two p-n junctions (the emitter-base and collector-base junctions) are in a single layer of semiconductor material separated by a specific distance. Modulation of the current flow in one p-n junction by changing the bias of the nearby junction is called "bipolar-transistor action."

External leads can be attached to each of the three regions and external voltages and currents can be applied to the device using these leads. If the emitter and collector are doped n-type and the base is doped p-type, the device is an "npn" transistor. Alternatively, if the opposite doping configuration is used, the device is a "pnp" transistor. Because the mobility of minority carriers (i.e., electrons) in the base region of npn transistors is higher than that of holes in the base of pnp transistors, higher-frequency operation and higher-speed performances can be obtained with npn devices. Therefore, npn transistors comprise the majority of bipolar transistors used to build integrated circuits.

The maximum (or cutoff) frequency of a pnp heterojunction bipolar transistor (HBT) is defined in part by the dopant concentration and thickness of a p-region between the n-type base and high doped p collector. As the dopant concentration of the p-region increases (or the thickness decreases), the collector resistance decreases, collector transit delay reduces and the cutoff frequency of the HBT increases. On the other hand, as the dopant concentration of the p-region decreases (or the thickness increases), the collector resistance increases, collector transit delay increases and the cutoff frequency of the HBT decreases.

The product of the breakdown voltage and the cutoff frequency produces a relatively constant value, which is commonly known as the Johnson limit. As the dopant concentration of the p-region increases, or the thickness reduces, the cutoff frequency of the HBT increases, while the breakdown voltage of the HBT decreases. On the other hand, as the dopant concentration of the p-region decreases or the thickness increases, the cutoff frequency of the HBT decreases while the breakdown voltage of HBT increases.

Similarly, the cutoff frequency of an npn HBT is defined in part by the dopant concentration and thickness of an n-region. Thus, as a result of the Johnson limit, as the dopant concentration of the n-region increases or the thickness reduces, the cutoff frequency of the HBT increases while the breakdown voltage of the HBT decreases. On the other hand, as the dopant concentration of n-region decreases or the thickness increases, the cutoff frequency of the HBT decreases while the breakdown voltage of HBT increases.

SUMMARY

According to one embodiment of the present invention, a method is provided. The method may include forming a substrate having a selectively implanted collector (SIC) and a collector separated by a shallow trench isolation (STI), a top portion of the STI is above the SIC and above the collector, forming a trench in the STI, the trench has a first depth, forming a sidewall spacer on sidewalls of the trench, recessing the trench to a second depth and a portion of the SIC is exposed by the trench, removing a portion of the exposed SIC in an undercut region of the SIC, forming a trench barrier in the undercut region, the trench barrier is on all exposed surfaces of the SIC in the undercut region, forming a field plate in the trench, the field plate extends into the undercut region, and the trench barrier is between the SIC and the field plate, forming a base layer above the SIC and above the field plate, the base layer is directly on top of the SIC, forming a heterojunction bipolar transistor (HBT) structure above the SIC, the HBT includes an emitter, the emitter is directly on top of the base layer, forming a fourth dielectric layer covering the HBT structure, the field plate and the collector, and forming an emitter contact, a field plate contact and a collector contact through the fourth dielectric layer, the emitter contact is in electrical connection with the emitter, the field plate contact is in electrical connection with the field plate, and the collector contact is in electrical connection with the collector.

According to another embodiment of the present invention, a method is provided. The method may include forming a substrate having a selectively implanted collector (SIC) and a collector separated by a shallow trench isolation (STI), a top portion of the STI is above the SIC and above the collector, forming a trench in the STI, the trench does not reach the SIC, forming a field plate in the trench, forming a base layer above the SIC and above the field plate, the base layer is directly on top of the SIC, forming a heterojunction bipolar transistor (HBT) structure above the SIC, the HBT includes an emitter, the emitter is directly on the base layer, and a portion of the field plate is below a bottom surface plane of the HBT structure, forming a fourth dielectric layer covering the HBT structure, the field plate and the collector, and forming an emitter contact, a field plate contact and a collector contact through the fourth dielectric layer, the emitter contact is in electrical connection with the emitter, the field plate contact is in electrical connection with the field plate, and the collector contact is in electrical connection with the collector.

According to another embodiment of the present invention, a structure is provided. The structure may include a substrate having a selectively implanted collector (SIC) and a collector separated by a shallow trench isolation (STI), a field plate in the STI, the field plate extends below a top surface of the SIC, a base layer directly on the SIC, a heterojunction bipolar transistor (HBT) structure above the SIC, the HBT includes an emitter, the emitter is directly on the base layer, a fourth dielectric layer covering the HBT structure, the field plate and the collector, and an emitter contact, a field plate contact and a collector contact extending through the fourth dielectric layer, the emitter contact is in electrical connection with the emitter, the field plate contact is in electrical connection with the field plate and the collector contact is in electrical connection with the collector.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
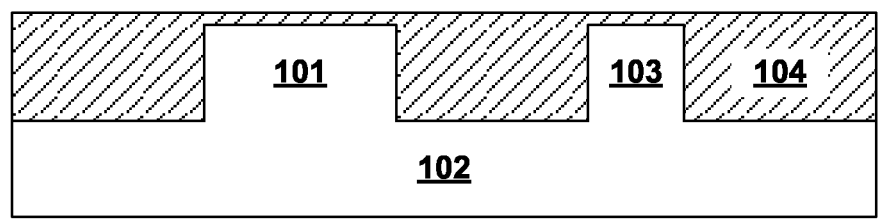
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the fabrication of a heterojunction bipolar transistor (HBT) and field plate with improved break-down voltage (BV). Ideally, it may be desirable to increase the breakdown voltage without sacrificing the cutoff frequency (fT). The purpose of forming an HBT having a field plate may be to split the electric field into a horizontal and vertical region. One way to form a HBT having a field plate is to form an isolation region having a field plate near a selectively implanted collector (SIC) where the field plate extends vertically below a base. One embodiment by which to form a HBT having a field plate is described in detail below with reference to the accompanying drawings FIGS. 1-14. Alternative embodiments of a HBT having a field plate are described in detail below with reference to the accompanying drawings FIGS. 15-22.

Referring now to FIG. 1, a demonstrative illustration of a structure 100 during an intermediate step of a method of fabricating an HBT with a field plate is provided, according to an exemplary embodiment. More specifically, the method can start with forming a substrate 102 having a selectively implanted collector (SIC) 101 and a collector 103 separated by a shallow trench isolation (STI) 104.

The substrate 102 may include; a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, the substrate 102 is a bulk silicon substrate. The substrate 102 may include the SIC 101 and the collector 103. The SIC 101 and the collector 103 may be, for example, n-type doped silicon for an npn HBT, where the SIC 101 and the substrate 102 are highly doped and the collector 103 has a lower dopant concentration.

A trench may be formed in the substrate 102 separating the SIC 101 and the collector 103. The trench may be formed using any lithography and etching technique known in the art, such as, for example, reactive ion dry etch or a wet chemical etch. The STI 104 may be formed in the trench and above the substrate 102 using any deposition technique known in the art, such as, for example, chemical vapor deposition, plasma enhanced chemical vapor deposition, atomic layer deposition, or physical vapor deposition. The STI 104 may cover the substrate 102, the SIC 101, and the collector 103. An isolation portion of the STI 104 is between the SIC 101 and the collector 103 and a top portion of the STI 104 is above the SIC 101 and above the collector 103. In an embodiment, the top portion of the STI 104 may have a thickness up to a few thousand angstroms (Å). The STI 104 may be any dielectric material known in the art, such as, for example, a silicon oxide and/or a silicon nitride. In an embodiment, the STI 104 may be planarized using any polishing technique known in the art, such as, for example, chemical mechanical polishing.

Figure 2:
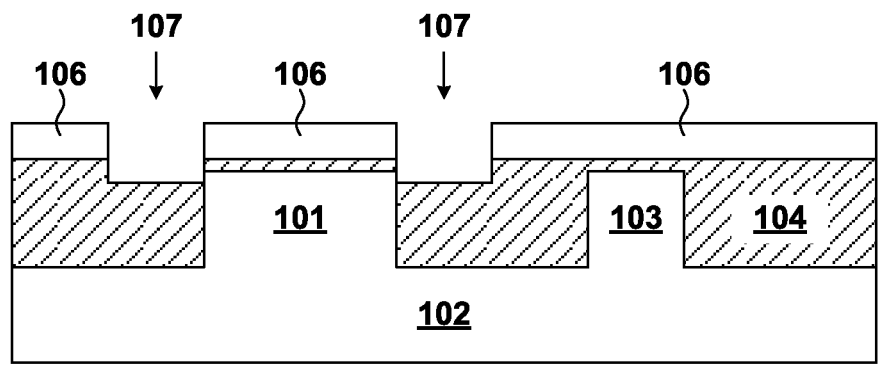
FIG. 2 is a cross section view of the semiconductor structure and illustrates the formation of a trench in a shallow trench isolation (STI), according to an exemplary embodiment.

Referring now to FIG. 2, a demonstrative illustration of the structure 100 during an intermediate step of a method of fabricating an HBT with a field plate is provided, according to an exemplary embodiment. More specifically, the method can include forming and patterning a first dielectric layer 106 on the STI 104 and forming a trench 107 in the isolation portion of the STI 104.

The first dielectric layer 106 may be formed on the STI 104 using any deposition technique known in the art, such as, for example, chemical vapor deposition, plasma enhanced chemical vapor deposition, atomic layer deposition, or physical vapor deposition. The first dielectric layer 106 may be any isolating material known in the art, such as, for example, an oxide and/or a nitride. In an embodiment the first dielectric layer 106 may be a nitride. The first dielectric layer 106 may be directly on the top portion of the STI 104. The first dielectric layer 106 may be patterned using any patterning technique known in the art, such as, for example, photolithography.

The trench 107 may be formed in the isolation portion of the STI 104 using any etching technique, such as, for example, a reactive ion dry etch or a wet chemical etch. The patterned first dielectric layer 106 may be used to define the dimensions of the trench 107, where the patterned first dielectric layer 106 acts as a mask. The trench 107 may be formed by etching the STI 104 selective to the first dielectric layer 106. The trench 107 may have a first depth ranging from about 0.01 μm to about 0.5 μm and may extend below a top surface of the SIC 101. The first depth may subsequently define the depth of a field plate below a top surface of the SIC 101. In an embodiment, the trench 107 may be on two sides of the SIC 101, such that each of the two sides of the SIC 101 are coplanar with a sidewall of the trench 107. In an alternative embodiment, the two sides of the SIC 101 may not be coplanar with the sidewall of the trench 107.

Figure 3:
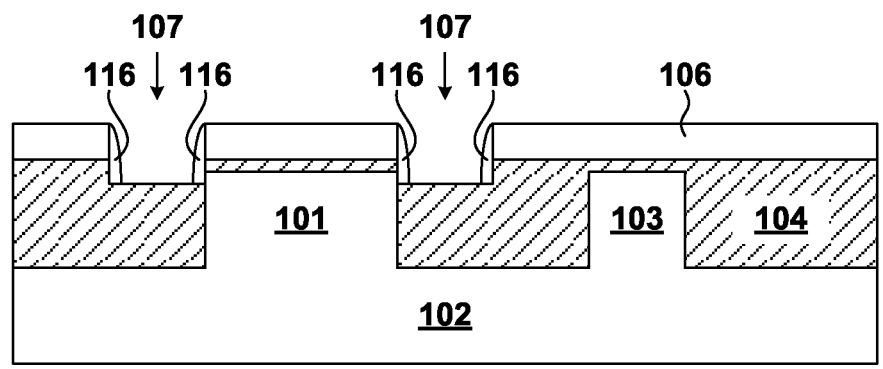
FIG. 3 is a cross section view of the semiconductor structure and illustrates the formation of a sidewall spacer on sidewalls of the trench, according to an exemplary embodiment.

Referring now to FIG. 3, a demonstrative illustration of the structure 100 during an intermediate step of a method of fabricating an HBT with a field plate is provided, according to an exemplary embodiment. More specifically, the method can include forming a sidewall spacer 116 on the sidewalls of the trench 107.

The sidewall spacer 116 may be formed on the sidewalls of the trench 107 using any spacer formation technique known in the art, such as, for example, conformally depositing a spacer layer on a structure and removing the spacer layer from horizontal surfaces using a directional etch. The sidewall spacer 116 may be any spacer material known in the art, such as, for example, oxides, nitrides, or oxynitrides. In an embodiment, the sidewall spacer 116 is a nitride.

Figure 4:
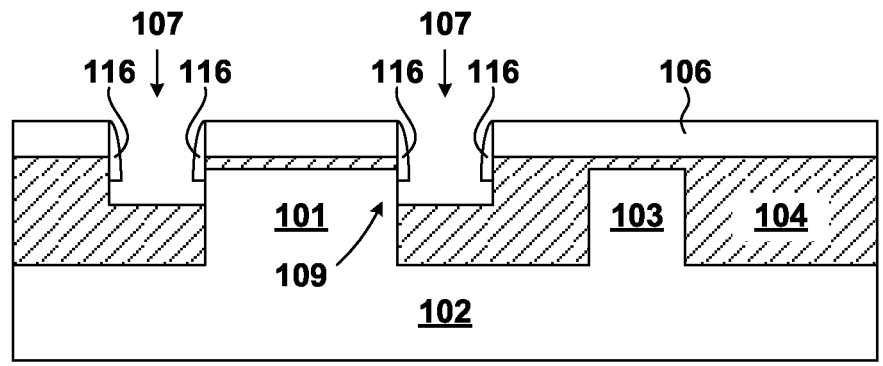
FIG. 4 is a cross section view of the semiconductor structure and illustrates the recessing of the trench to a second depth, according to an exemplary embodiment.

Referring now to FIG. 4, a demonstrative illustration of the structure 100 during an intermediate step of a method of fabricating an HBT with a field plate is provided, according to an exemplary embodiment. More specifically, the method can include recessing the trench 107.

The trench 107 may be recessed below a bottom surface of the sidewall spacer 116 using any etching technique known in the art, such as, for example, a wet or dry etch. The trench 107 may be recessed to a second depth. A bottom surface of the trench 107 may be below a top surface of the SIC 101. In an embodiment, the trench 107 may be formed using an isotropic process and may be selective to the SIC 101, such that the trench 107 exposes a portion of the SIC 101 in an undercut region 109.

Figure 5:
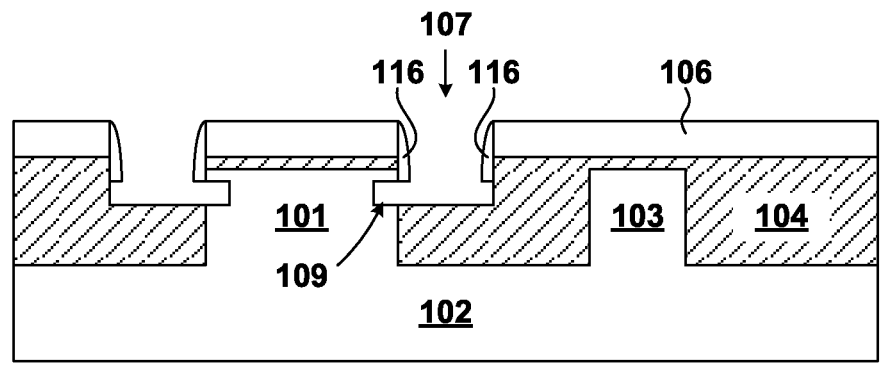
FIG. 5 is a cross section view of the semiconductor structure and illustrates the removal of a portion of a selectively implanted collector (SIC) from an undercut region, according to an exemplary embodiment.

Referring now to FIG. 5, a demonstrative illustration of the structure 100 during an intermediate step of a method of fabricating an HBT with a field plate is provided, according to an exemplary embodiment. More specifically, the method can include removing a portion of the SIC 101 from the undercut region 109.

The SIC 101 may be removed from the undercut region 109 using any etching technique known in the art, such as, for example, a wet or dry etch. The SIC 101 in the undercut region 109 may be etched selective to the STI 104. Once the SIC 101 is removed from the undercut region 109, an exposed portion of the SIC 101 around the undercut region 109 may have an undercut surface having an undercut profile, such as, for example, a box-like profile, a lateral triangular profile, a lateral diamond profile, or a tapered profile. The undercut profile may be dependent on the crystallographic orientation of the substrate 102.

Figure 6:
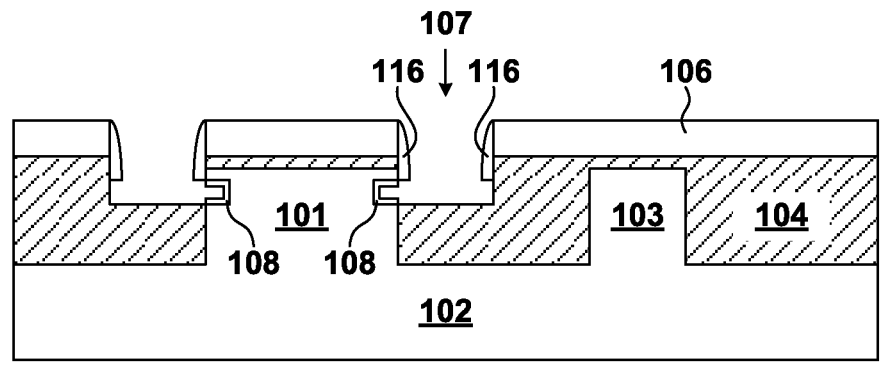
FIG. 6 is a cross section view of the semiconductor structure and illustrates the formation of a trench barrier on exposed portion of the SIC in the undercut region, according to an exemplary embodiment.

Referring now to FIG. 6, a demonstrative illustration of the structure 100 during an intermediate step of a method of fabricating an HBT with a field plate is provided, according to an exemplary embodiment. More specifically, the method can include forming a trench barrier 108 on the undercut surface of the SIC 101. The trench barrier 108 may be formed on the undercut surface of the SIC 101 using any barrier formation technique known in the art, such as, for example, oxidation of the exposed SIC 101. The trench barrier 108 may have a conformal thickness of up to about 100 Å.

Figure 7:
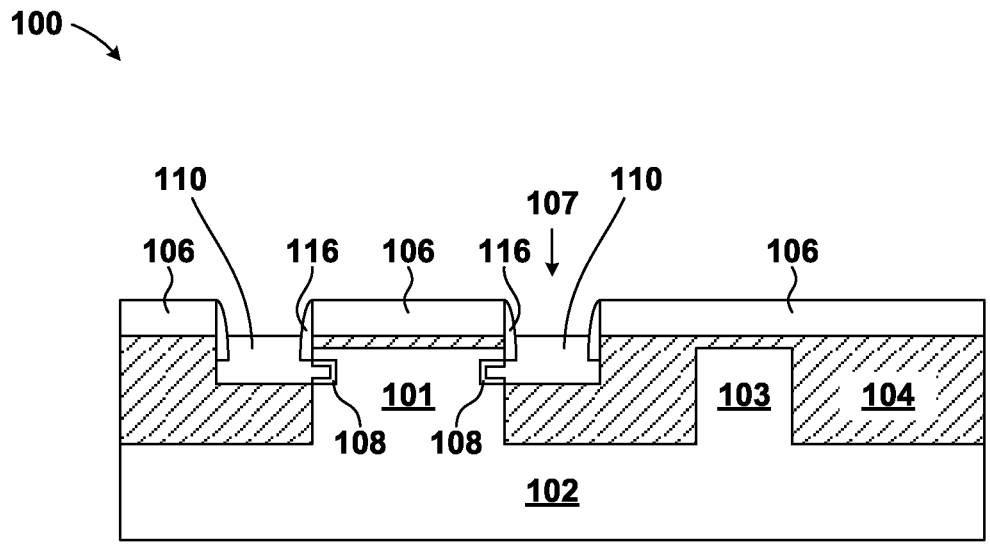
FIG. 7 is a cross section view of the semiconductor structure and illustrates the formation of a field plate in the trench, according to an exemplary embodiment.

Referring now to FIG. 7, a demonstrative illustration of the structure 100 during an intermediate step of a method of fabricating an HBT with a field plate is provided, according to an exemplary embodiment. More specifically, the method can include forming a field plate 110 in the trench 107.

The field plate 110 may be formed in the trench 107 using any deposition technique known in the art, such as, for example, chemical vapor deposition, plasma enhanced chemical vapor deposition, atomic layer deposition, or physical vapor deposition. The field plate 110 may fill a portion of the trench 107 or the entire trench 107. The field plate 110 may extend into the undercut region 109 of the trench 107, where, for example, the trench barrier 108 is between the SIC 101 and the field plate 110. One benefit to having the field plate 110 extend into the undercut region 109 may included better electrical field control for subsequently formed heterojunction bipolar transistors by separating the electrical field into a horizontal electrical field and a vertical electrical field. The field plate 110 may be any semiconductor material know in the art, such as, for example, silicon or germanium. In an embodiment, the field plate 110 is a flowable polysilicon. The field plate 110 may be etched back having a top surface that is coplanar with a top surface of the STI 104.

Figure 8:
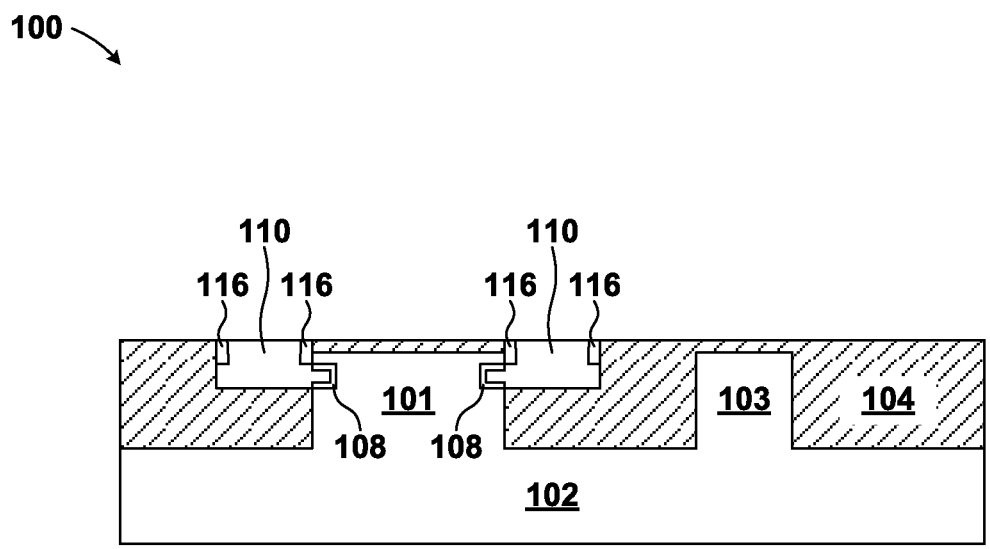
FIG. 8 is a cross section view of the semiconductor structure and illustrates the removal of a first dielectric layer, according to an exemplary embodiment.

Referring now to FIG. 8, a demonstrative illustration of the structure 100 during an intermediate step of a method of fabricating an HBT with a field plate is provided, according to an exemplary embodiment. More specifically, the method can include removing the first dielectric layer 106 and planarizing a top surface. The first dielectric layer 106 may be removed by polishing the structure 100 and/or etching back the first dielectric layer 106, such that the STI 104 is exposed. In an embodiment, the first dielectric layer 106 is removed using a chemical mechanical polishing technique, where the STI 104, the sidewall spacer 116, and the field plate 110 share a coplanar top surface.

Figure 9:
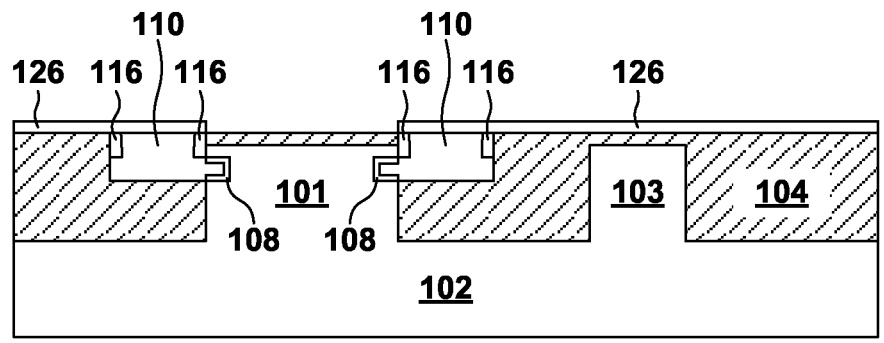
FIG. 9 is a cross section view of the semiconductor structure and illustrates the formation of a second dielectric layer above the field plate, according to an exemplary embodiment.

Referring now to FIG. 9, a demonstrative illustration of the structure 100 during an intermediate step of a method of fabricating an HBT with a field plate is provided, according to an exemplary embodiment. More specifically, the method can include forming a second dielectric layer 126.

The second dielectric layer 126 may be conformally formed on, for example, the coplanar top surface of the STI 104, the sidewall spacer 116 and the field plate 110. The second dielectric layer 126 may be formed using any deposition technique known in the art, such as, for example, chemical vapor deposition, plasma enhanced chemical vapor deposition, atomic layer deposition, or physical vapor deposition. The second dielectric 126 may be any dielectric material known in the art, such as, for example, an oxide, nitride, or a stack of nitride, oxide, oxynitrides, and/or polysilicon. The second dielectric layer 126 may be above the SIC 101, the field plate 110 and the collector 103. In an embodiment, the second dielectric layer 126 may be removed from above the SIC 101, such that the top portion of the STI 104 above the SIC 101 is exposed. In an embodiment, the second dielectric layer 126 may remain above the field plate 110 and above the collector 103.

Figure 10:
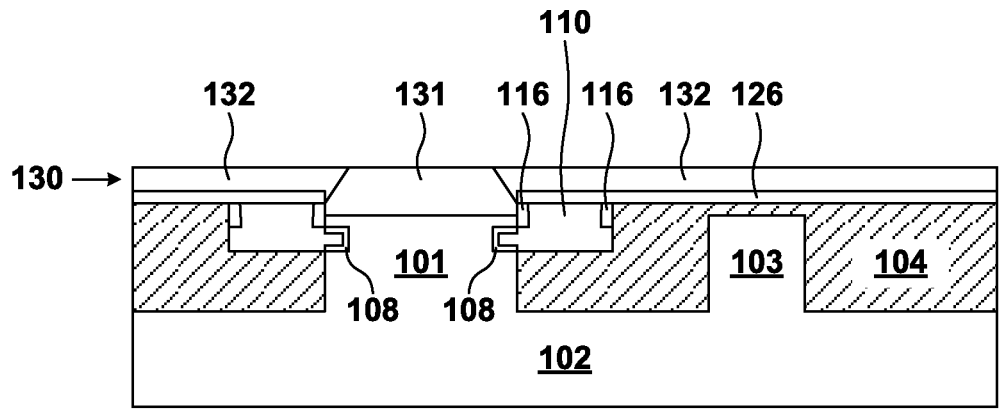
FIG. 10 is a cross section view of the semiconductor structure and illustrates the formation of a base layer above the SIC, according to an exemplary embodiment.

Referring now to FIG. 10, a demonstrative illustration of the structure 100 during an intermediate step of a method of fabricating an HBT with a field plate is provided, according to an exemplary embodiment. More specifically, the method can include forming a base layer 130 on the second dielectric layer 126.

The base layer 130 may be a low temperature epitaxy layer (LTE) layer. The base layer 130 may be formed on the second nitride layer 126 and on the SIC 101 using any deposition or growth technique known in the art, such as, for example, a low temperature epitaxial growth process. The base layer 130 may include a single-crystalline layer 131 and a polycrystalline layer 132. The single-crystalline layer 131 may be formed on the SIC 101 and consume the top portion of the STI 104 above the SIC 101. The polycrystalline layer 132 may be a portion of the base layer 130 grown on the second dielectric layer 126.

The base layer 130 may have a thickness ranging from about 300 Å to about 5000 Å. If the thickness of the base layer 130 is greater than about 1000 Å, then the single-crystalline layer 131 may be used as an intrinsic base and the polycrystalline layer 132 may be an extrinsic base for a heterojunction bipolar transistor. If the thickness of the base layer 130 is less than about 1000 Å, then an additional step may be required to form a separate extrinsic base layer above the base layer 130.

Figure 11:
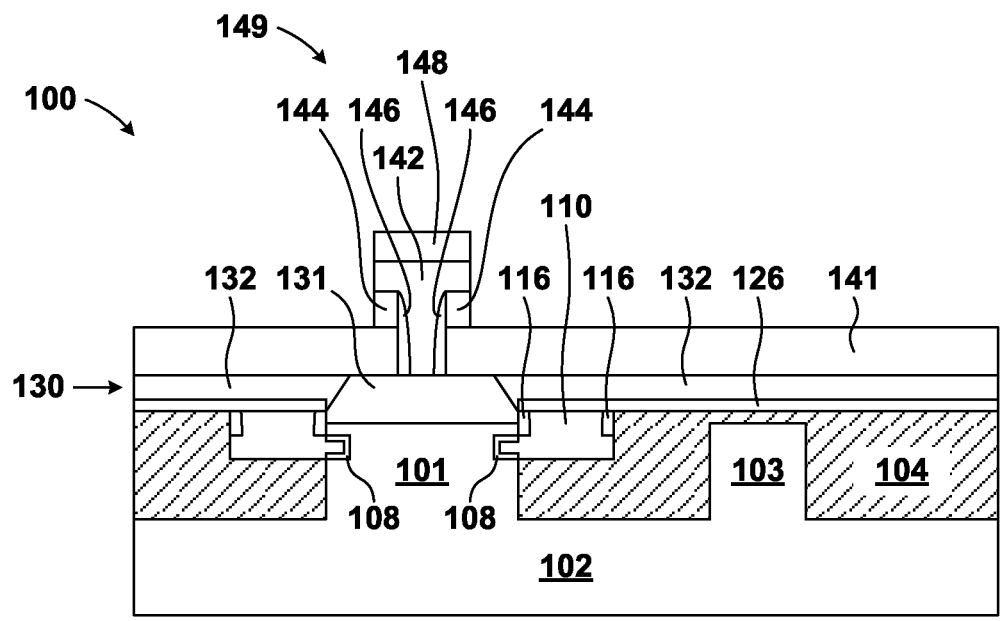
FIG. 11 is a cross section view of the semiconductor structure and illustrates the formation of a heterojunction bipolar transistor (HBT) structure on an extrinsic base layer, according to an exemplary embodiment.

Referring now to FIG. 11, a demonstrative illustration of the structure 100 during an intermediate step of a method of fabricating an HBT with a field plate is provided, according to an exemplary embodiment. More specifically, the method can include forming a heterojunction bipolar transistor (HBT) structure 149 above an extrinsic base layer 141.

In an embodiment, the extrinsic base layer 141 may be formed on the base layer 130 using any deposition technique known in the art, such as, for example, chemical vapor deposition, plasma enhanced chemical vapor deposition, atomic layer deposition, or physical vapor deposition. The extrinsic base layer 141 may be any semiconductor material known in the art, such as, for example, silicon or germanium. In an embodiment, the extrinsic base layer 141 may be polysilicon. An opening may be formed in the extrinsic base layer 141 exposing a portion of the single-crystalline layer 131.

The HBT structure 149 may be formed in the extrinsic base layer 141 opening and on the single-crystalline layer 131 using any structure formation techniques know in the art, such as, for example, a combination of deposition, etching and lithography. The HBT structure 149 may include structure elements that are known in the art, such as, for example, an emitter 142, a structure insulator 144, a structure spacer 146, and a structure cap 148. In an embodiment, the emitter 142 may be polysilicon, the structure spacer 146 and the structure cap 148 may be a nitride, and the structure insulator 144 may be an oxide.

Figure 12:
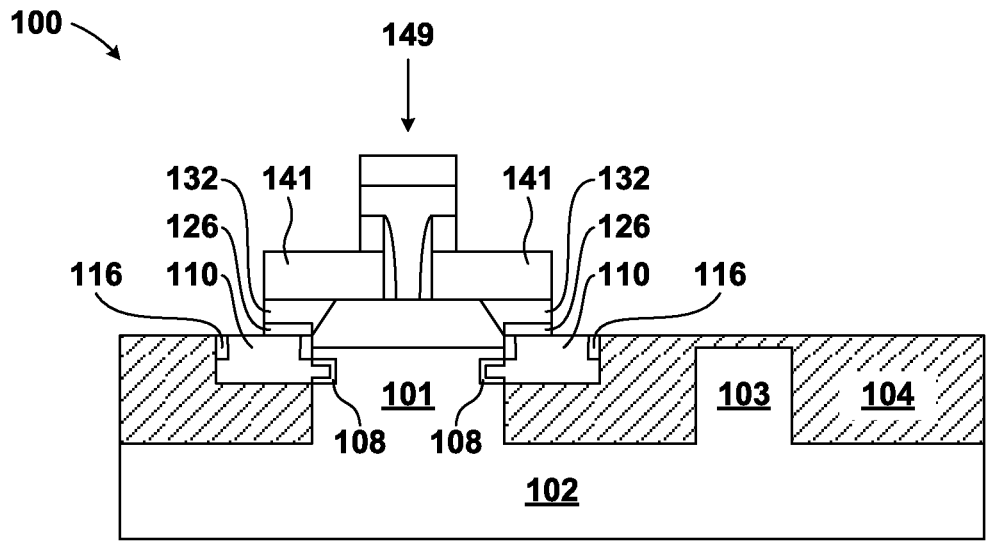
FIG. 12 is a cross section view of the semiconductor structure and illustrates the removal of the extrinsic base layer and the base layer exposing a portion of the field plate, according to an exemplary embodiment.

Referring now to FIG. 12, a demonstrative illustration of the structure 100 during an intermediate step of a method of fabricating an HBT with a field plate is provided, according to an exemplary embodiment. More specifically, the method can include removing a portion of the extrinsic base layer 141, the base layer 130 and the second dielectric layer 126 from above the collector 103 and above a portion of the field plate 110. The extrinsic base layer 141, the base layer 130 and the second dielectric layer 126 may be removed using any etching techniques known in the art, such as, for example, reactive ion dry etch or a wet chemical etch, such that a portion of the field plate 110 is exposed.

Figure 13:
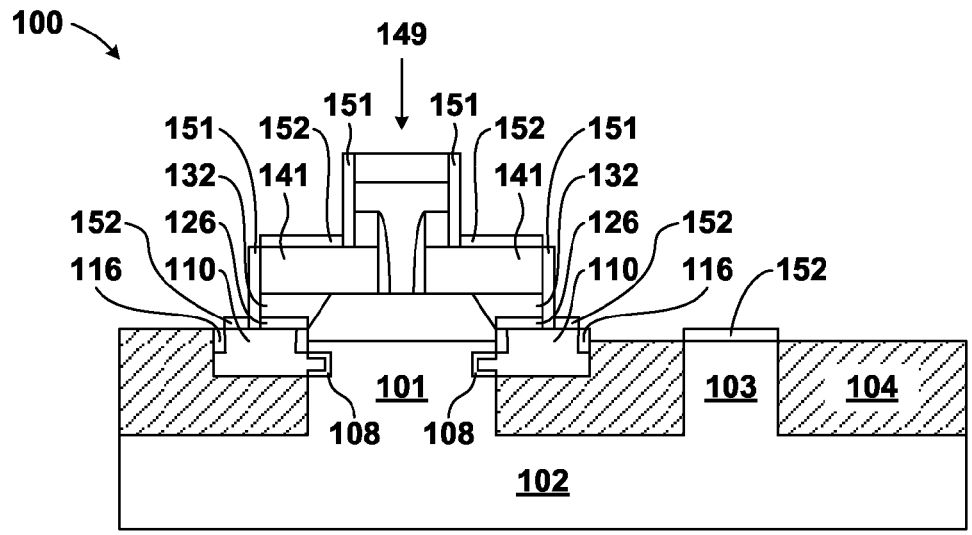
FIG. 13 is a cross section view of the semiconductor structure and illustrates the formation of a connecting layer on the field plate, the collector, and the extrinsic base layer, according to an exemplary embodiment.

Referring now to FIG. 13, a demonstrative illustration of the structure 100 during an intermediate step of a method of fabricating an HBT with a field plate is provided, according to an exemplary embodiment. More specifically, the method can include forming a third dielectric layer 151 on vertical surfaces and a connecting layer 152 on the field plate 110 and on the collector 103.

The third dielectric layer 151 may be formed on, for example, the sidewalls of the HBT structure 149, the extrinsic base layer 141 and the base layer 130. In an embodiment, the third dielectric layer 151 may be a nitride. The connecting layer 152 may be formed on, for example, the collector 103, the field plate 110, and the extrinsic base layer 141. In an embodiment, the connecting layer 152 may be a silicide. The connecting layer 152 may provide an interface for subsequently formed contacts.

Figure 14:
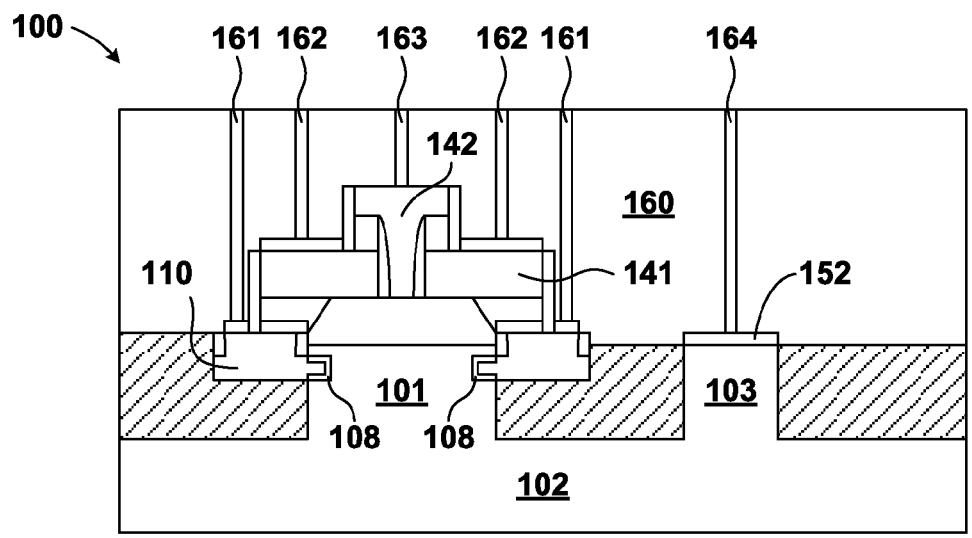
FIG. 14 is a cross section view of the semiconductor structure and illustrates the formation of a field plate contact, a base contact, an emitter contact, and a collector contact, according to an exemplary embodiment.

Referring now to FIG. 14, a demonstrative illustration of the structure 100 during an intermediate step of a method of fabricating an HBT with a field plate is provided, according to an exemplary embodiment. More specifically, the method can include forming a field plate contact 161, a base contact 162, an emitter contact 163, and a collector contact 164.

The field plate contact 161, the base contact 162, the emitter contact 163, and the collector contact 164 may extend through a fourth dielectric layer 160 and connect to the field plate 110, the extrinsic base layer 141, the emitter 142, and the collector 103, respectively. The field plate contact 161, the base contact 162, the emitter contact 163, and the collector contact 164 may be formed using any techniques known in the art, such as, for example, a damascene process. The field plate contact 161, the base contact 162, the emitter contact 163, and the collector contact 164 may include any conductive material known in the art, such as, for example, a metal. The structure cap 148 (illustrated in FIG. 11) may be removed during the formation of the fourth dielectric layer 160, the emitter contact 163, or during any other step.

Figure 15:
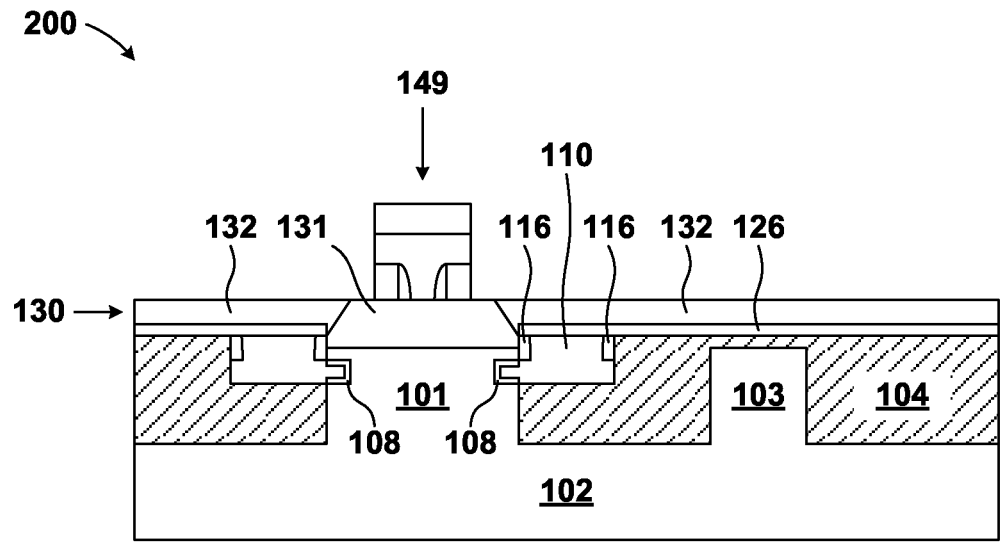
FIG. 15 is a cross section view of an alternative semiconductor structure and illustrates the formation of the HBT directly on the base layer, according to an exemplary embodiment.
Figure 16:
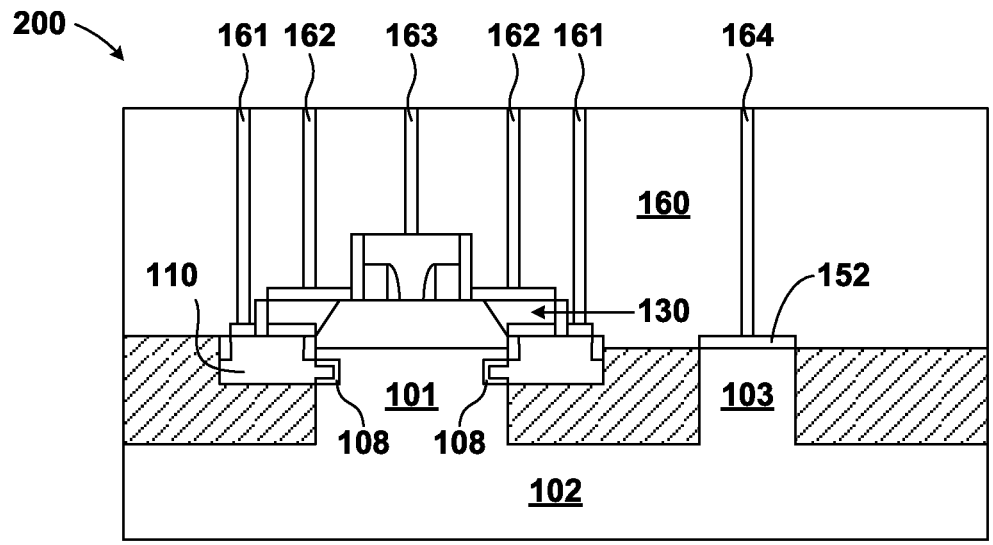
FIG. 16 is a cross section view of the alternative semiconductor structure and illustrates the formation of the field plate contact, the base contact, the emitter contact, and the collector contact, according to an exemplary embodiment.

Referring now to FIGS. 15 and 16, a demonstrative illustration of an alternative structure 200 during an intermediate step of a method of fabricating an HBT with a field plate is provided, according to an exemplary embodiment. More specifically, the method can include forming the HBT structure 149 directly on the base layer 130. It should be noted, the alternative structure 200 illustrated in FIG. 15 may be formed in a similar intermediate step as the structure 100 illustrated in FIG. 11. The alternative structure 200 illustrated in FIG. 16 may be formed in a similar intermediate step as the structure 100 illustrated in FIG. 14.

In an alternative embodiment, the extrinsic base layer 141 (illustrated in FIG. 11) may be omitted, such that the HBT structure 149 is formed directly on the base layer 130. The base layer 130 may be used as both an intrinsic base and an extrinsic base for the HBT structure 149. This alternative embodiment may provide less processing steps, however, the base layer 130 may need to be thicker than about 1000 Å to avoid malfunction.

Figure 17:
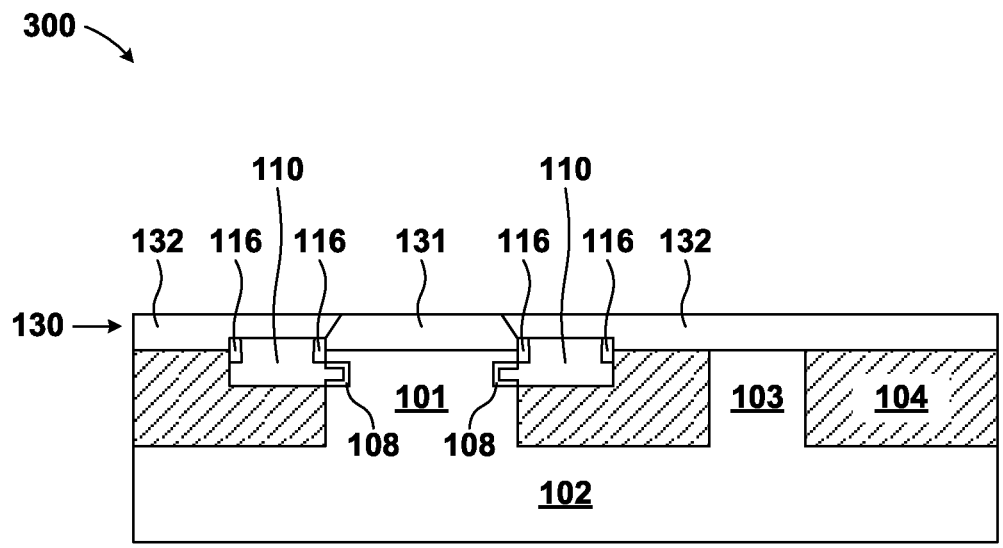
FIG. 17 is a cross section view of an alternative semiconductor structure and illustrates the formation of the base layer, according to an exemplary embodiment.
Figure 18:
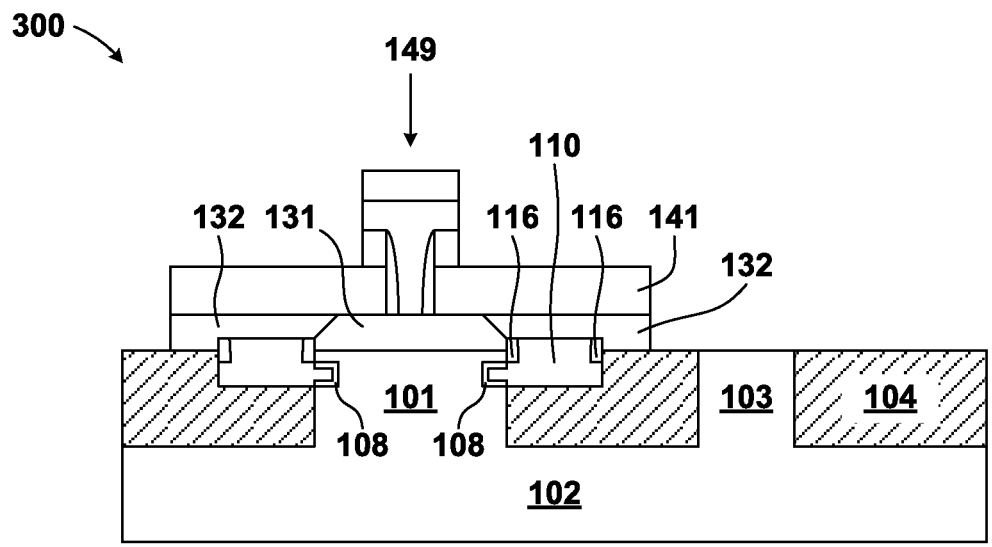
FIG. 18 is a cross section view of the alternative semiconductor structure and illustrates the formation of the HBT structure on the extrinsic base layer, according to an exemplary embodiment.
Figure 19:
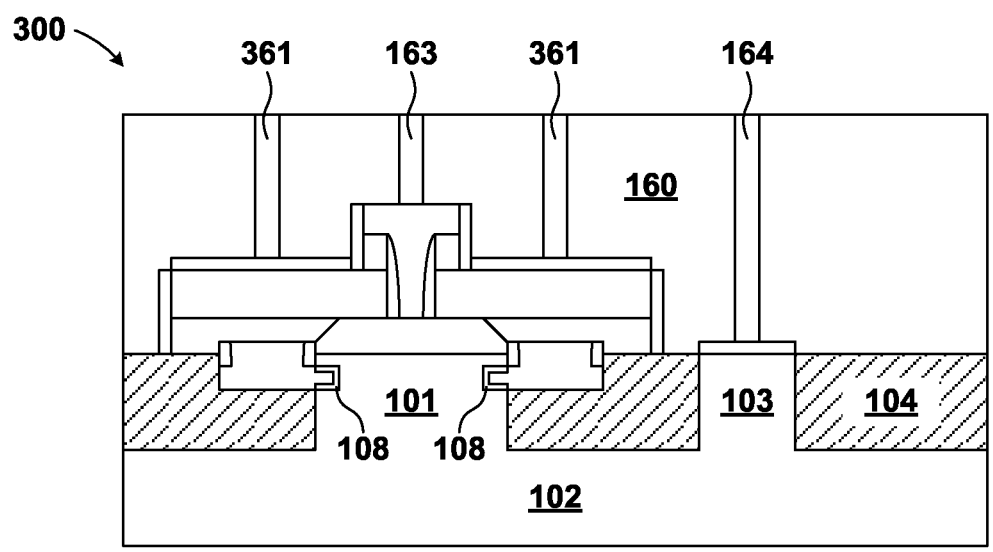
FIG. 19 is a cross section view of the alternative semiconductor structure and illustrates the formation of the field plate contact, the emitter contact, and the collector contact, according to an exemplary embodiment.

Referring now to FIGS. 17-19, a demonstrative illustration of an alternative structure 300 during an intermediate step of a method of fabricating an HBT with a field plate is provided, according to an exemplary embodiment. More specifically, the method can include forming the extrinsic base layer 141 and the field plate 110 with a single contact 361. It should be noted, the alternative structure 300 illustrated in FIG. 17 may be formed in a similar intermediate step as the structure 100 illustrated in FIG. 10. The alternative structure 300 illustrated in FIG. 18 may be formed in a similar intermediate step as the structure 100 illustrated in FIG. 12. The alternative structure 300 illustrated in FIG. 19 may be formed in a similar intermediate step as the structure 100 illustrated in FIG. 14.

In an alternative embodiment, the field plate 110 may be entirely under an extrinsic base (e.g., the base layer 130 and/or the extrinsic base layer 130), such that a single contact 361 can control both the field plate 110 and the extrinsic base. The alternative structure 300 may not include a second dielectric layer 126 (illustrated in FIG. 9); however, other alternative embodiments may include the second dielectric 126. The alternative structure 300 may provide less processing steps; however, the field plate 110 and the extrinsic base may not be independently controlled.

Figure 20:
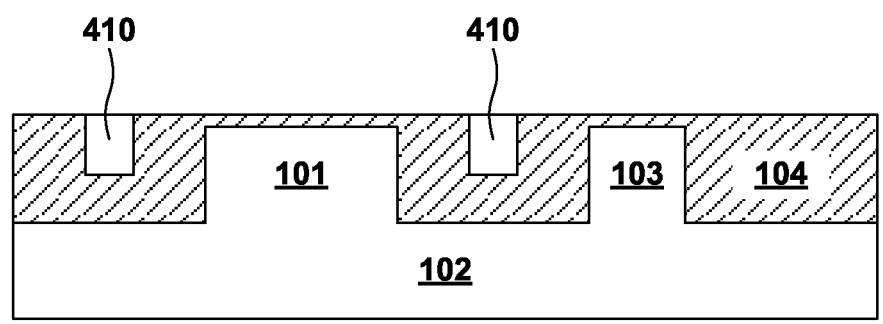
FIG. 20 is a cross section view of an alternative semiconductor structure and illustrates the formation of an alternative field plate, according to an exemplary embodiment.
Figure 21:
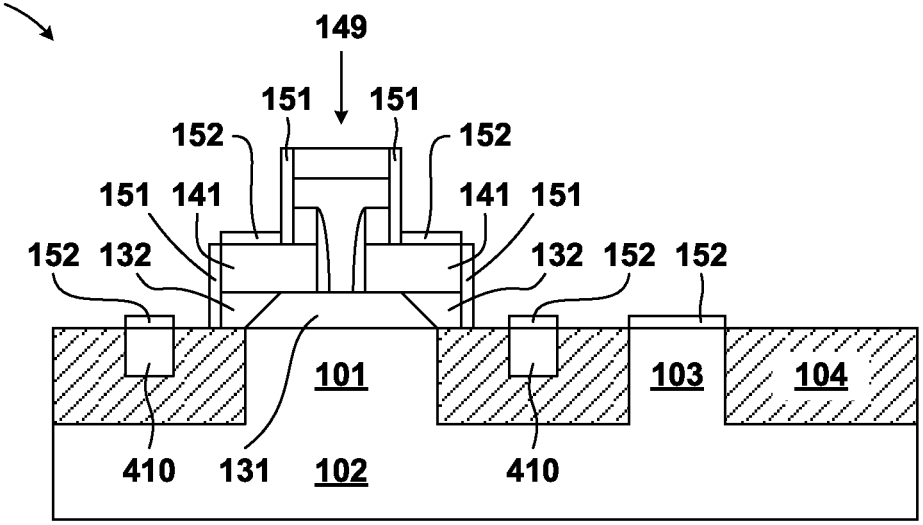
FIG. 21 is a cross section view of the alternative semiconductor structure and illustrates the formation of the HBT structure, according to an exemplary embodiment.
Figure 22:
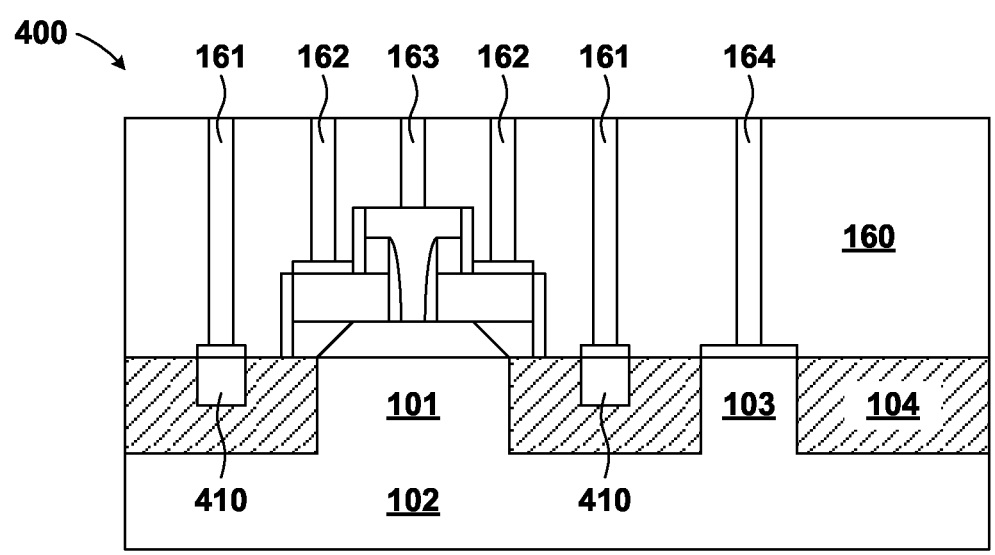
FIG. 22 is a cross section view of the alternative semiconductor structure and illustrates the formation of the field plate contact, the base contact, the emitter contact, and the collector contact, according to an exemplary embodiment.

Referring now to FIGS. 20-22, a demonstrative illustration of an alternative structure 400 during an intermediate step of a method of fabricating an HBT with a field plate is provided, according to an exemplary embodiment. More specifically, the method can include forming an alternative field plate 410 in the STI 104, such that the alternative field plate 410 does not undercut into the SIC 101. It should be noted, the alternative structure 400 illustrated in FIG. 20 may be formed in a similar intermediate step as the structure 100 illustrated in FIG. 2. The alternative structure 400 illustrated in FIG. 21 may be formed in a similar intermediate step as the structure 100 illustrated in FIG. 13. The alternative structure 400 illustrated in FIG. 22 may be formed in a similar intermediate step as the structure 100 illustrated in FIG. 14. The alternative structure 400 may reduce the number of processing steps relative to the structure 100; however, the alternative field plate 410 may have less horizontal control than the structure 100.

The purpose of having a field plate that extends into the STI 104 may include better electric field distribution among a horizontal and vertical direction. The electrical field distribution in the vertical direction may help increase breakdown voltage without significantly affecting the maximum frequency (Johnson Limit). The electrical field distribution in the vertical direction may allow for a higher bias applied to the HBT to get the same breakdown voltage. The purpose of the undercut embodiments described above may be to further increase the ability to control the electrical field through the field plate, however, a vertical field plate (e.g., the alternative field plate 410) may still allow for an electrical field distribution to also be in the vertical direction and help increase the bias applied to the HBT to get the same breakdown voltage.

Other alternative embodiments may also include, but not limited to, any combination of the embodiments described herein. For example, an alternative embodiment may be similar to the alternative structure 300, such that a single control is used; however, the alternative embodiment may not include the extrinsic base layer 141 illustrated in FIG. 18. Another alternative embodiment may be similar to the alternative structure 400, such that the field plate does not undercut into the SIC 101; however, the alternative embodiment may not include the extrinsic base layer 141 illustrated in FIG. 21.

It should be noted, number identifiers in the illustrations referring to an embodiment may correlate to similar number identifiers in the illustrations referring to alternative embodiments. Similar number identifiers may indicate similar characteristics, such as, for example, material, thickness, location, formation technique, and/or purpose.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a substrate having a selectively implanted collector (SIC) and a collector separated by a shallow trench isolation (STI), a top portion of the STI is above the SIC and above the collector;
   forming a trench in the STI, the trench has a first depth;
   forming a sidewall spacer on sidewalls of the trench;
   recessing the trench to a second depth and a portion of the SIC is exposed by the trench;
   removing a portion of the exposed SIC in an undercut region of the SIC;
   forming a trench barrier in the undercut region, the trench barrier is on all exposed surfaces of the SIC in the undercut region;
   forming a field plate in the trench, the field plate extends into the undercut region, and the trench barrier is between the SIC and the field plate;
   forming a base layer above the SIC and above the field plate, the base layer is directly on top of the SIC;
   forming a heterojunction bipolar transistor (HBT) structure above the SIC, the HBT includes an emitter, the emitter is directly on top of the base layer;
   forming a fourth dielectric layer covering the HBT structure, the field plate and the collector; and
   forming an emitter contact, a field plate contact and a collector contact through the fourth dielectric layer, the emitter contact is in electrical connection with the emitter, the field plate contact is in electrical connection with the field plate, and the collector contact is in electrical connection with the collector.

2. The method of claim 1, further comprising:
   forming a second dielectric on a coplanar top surface of the field plate and the STI, the second dielectric is between the base layer and the field plate, and the top portion of the STI above the SIC is not covered by the second dielectric.

3. The method of claim 1, further comprising:
   forming an extrinsic base layer on the base layer, wherein a portion of the HBT is above the extrinsic base layer and the emitter extends through the extrinsic base layer.

4. The method of claim 1, further comprising:
   forming a base contact through the fourth dielectric layer, the base contact is in electrical connection with the base layer, wherein the base layer is not in electrical connection with the field plate.

5. The method of claim 1, wherein the field plate contact is in electrical connection with the base layer and the field plate.

6. The method of claim 1, wherein the undercut region has an undercut profile, and wherein the undercut profile is a box-like profile, a lateral triangular profile, a lateral diamond profile, or a tapered profile.

7. The method of claim 1, wherein the STI and the trench barrier are oxides, the base layer includes germanium and silicon-germanium, the field plate and the emitter are poly-silicon, and the substrate is silicon.

8. A method comprising:
   forming a substrate having a selectively implanted collector (SIC) and a collector separated by a shallow trench isolation (STI), a top portion of the STI is above the SIC and above the collector;
   forming a trench in the STI, the trench does not reach the SIC;
   forming a field plate in the trench;
   forming a base layer above the SIC and above the field plate, the base layer is directly on top of the SIC;
   forming a heterojunction bipolar transistor (HBT) structure above the SIC, the HBT includes an emitter, the emitter is directly on the base layer, and a portion of the field plate is below a bottom surface plane of the HBT structure;
   forming a fourth dielectric layer covering the HBT structure, the field plate and the collector; and
   forming an emitter contact, a field plate contact and a collector contact through the fourth dielectric layer, the emitter contact is in electrical connection with the emitter, the field plate contact is in electrical connection with the field plate, and the collector contact is in electrical connection with the collector.

9. The method of claim 8, further comprising:
   forming a second dielectric on a coplanar top surface of the field plate and the STI, the second dielectric is between the base layer and the field plate, and the top portion of the STI above the SIC is not covered by the second dielectric.

10. The method of claim 8, further comprising:
    forming an extrinsic base layer on the base layer, wherein a portion of the HBT is above the extrinsic base layer and the emitter extends through the extrinsic base layer.

11. The method of claim 8, further comprising:
    forming a base contact through the fourth dielectric layer, the base contact is in electrical connection with the base layer, wherein the base layer is not in electrical connection with the field plate.

12. The method of claim 8, wherein the field plate contact is in electrical connection with the base layer and the field plate.

13. The method of claim 8, wherein the STI is an oxide, the base layer includes germanium and silicon-germanium, the field plate and the emitter are poly-silicon, and the substrate is silicon.

14. A structure comprising:
    a substrate having a selectively implanted collector (SIC) and a collector separated by a shallow trench isolation (STI);
    a field plate in the STI, the field plate extends below a top surface of the SIC;
    a base layer directly on the SIC;
    a heterojunction bipolar transistor (HBT) structure above the SIC, the HBT includes an emitter, the emitter is directly on the base layer;
    a fourth dielectric layer covering the HBT structure, the field plate and the collector; and
    an emitter contact, a field plate contact and a collector contact extending through the fourth dielectric layer, the emitter contact is in electrical connection with the emitter, the field plate contact is in electrical connection with the field plate and the collector contact is in electrical connection with the collector.

15. The structure of claim 14, wherein the field plate extends into an undercut region in the SIC, further comprising:
    a trench barrier in the undercut region, the trench barrier is between the field plate and the SIC.

16. The structure of claim 15, wherein the undercut region has an undercut surface having an undercut profile, and wherein the undercut profile is a box-like profile, a lateral triangular profile, a lateral diamond profile, or a tapered profile.

17. The structure of claim 14, further comprising:
    a second dielectric layer between the field plate and the base layer.
18. The structure of claim 14, further comprising:
    an extrinsic base layer on top of the base layer, wherein the extrinsic base layer is poly-silicon.
19. The structure of claim 14, further comprising:
    a base contact extending through the fourth dielectric layer, the base contact is in electrical connection with the base layer, wherein the base layer is not in electrical connection with the field plate.
20. The structure of claim 14, wherein the field plate contact is in electrical connection with the base layer and the field plate.

\* \* \* \* \*